United States Patent [19]

Endo et al.

[11] 4,449,108

[45] May 15, 1984

[54] BAND-STOP FILTER FOR VHF-UHF BAND

[75] Inventors: Haruyoshi Endo, Sagamihara; Mitsuo Makimoto, Yokohama; Ko Kikuchi, Tokyo; Sadahiko Yamashita, Sagamihara, all of Japan

[73] Assignee: Matsushita Electric Industrial Company, Limited, Osaka, Japan

[21] Appl. No.: 348,768

[22] Filed: Feb. 16, 1982

[30] Foreign Application Priority Data

Feb. 17, 1981 [JP] Japan .................................. 56-22600

[51] Int. Cl.$^3$ ......................... H01P 1/202; H01P 7/04; H03H 7/01

[52] U.S. Cl. ..................................... 333/202; 333/134; 333/206; 333/222

[58] Field of Search ......................... 333/202, 204–209, 333/212, 219–223, 104, 124, 132, 134, 135, 167, 168, 100, 125–126; 343/850

[56] References Cited

U.S. PATENT DOCUMENTS 4,382,238 5/1983 Makimoto et al. ............. 333/206 X

*Primary Examiner*—Marvin L. Nussbaum
*Attorney, Agent, or Firm*—Lowe, King, Price & Becker

[57] ABSTRACT

A band-stop filter for VHF-UHF band comprises at least three series resonance circuits and at least two transmission lines each connected between the series resonance circuits. One of the transmission lines, which is connected to the input terminal of the band-stop filter, has an electrical length which is shorter or longer than the quarter wavelength of the center frequency of the stop band by more than 20 but less than 50 percent. When a band-stop filter comprises four transmission lines, one of the transmission lines, which is connected to the output terminal of the band-stop filter, has the same length as the transmission line connected to the input terminal. With this arrangement, the band-stop filter exhibits a sharp attenuation characteristic in a frequency range below or above the center frequency. Other transmission lines, which are not directly connected to either the input terminal or the output terminal, may have a length which is shorter or longer than the quarter wavelength by 5 to 20 percent so as to provide a sharper attenuation characteristic.

7 Claims, 7 Drawing Figures

BAND-STOP FILTER FOR VHF-UHF BAND

BACKGROUND OF THE INVENTION

This invention relates generally to band-stop or band-rejection filters for VHF (very high frequency) and/or UHF (ultrahigh frequency) band, and more particularly, the present invention relates to such a filter having a plurality of series resonance circuits connected by transmission lines.

Conventional band-stop filters used in the VHF-UHF bands usually comprise a plurality of series resonance circuits, where each resonance circuit has a high value of unloaded Q and is of a distributed constant type. The series resonance circuits are connected by transmission lines, and usually the length of each transmission line connected between two series resonance circuits is selected to a value which equals a quarter wavelength of the center frequency in the stop band. The frequency characteristic curve of the insertion loss of such a conventional band-stop filter is substantially symmetrical with respect to the center frequency. When such symmetry of the insertion loss with respect to the center frequency is not required, but when a sharper attenuation characteristic is required, the length of each transmission line between adjacent series resonance circuits may be reduced by 5 to 20 percent from a quarter wavelength as already proposed by the inventors of the present invention. Alternatively, the length of each transmission line may be lengthened from the quarter wavelength to obtain a similar effect. Although such already known band-stop filters can provide an attenuation characteristic which is sharper than that of the conventional band-stop filters having transmission lines whose length equal quarter wavelength, the sharpness is not adequate when a further sharper attenuation characteristic is required.

SUMMARY OF THE INVENTION

The present invention has been developed in order to better the attenuation characteristic in band-stop filters for VHF-UHF band.

It is, therefore, an object of the present invention to provide a band-stop filter for VHF-UHF band, having a very sharp attenuation characteristic curve which could not be obtained by various techniques developed hitherto.

Another object of the present invention is to provide such a band-stop filter which is simple in construction and low in manufacturing cost.

In accordance with the present invention there is provided a band-stop filter for VHF-UHF band d, comprising: at least three series resonance circuits, one of said series resonance circuits being connected between an input terminal and ground, and another one of said series resonance circuits being connected between an output terminal and ground; and a plurality of transmission lines each connected between said series resonance circuits. One of said transmission lines, which is connected to said input terminal, has an electrical length which is shorter or longer than the quarter wavelength of the center frequency of the stop band of said band-stop filter by more than 20 but less than 50 percent.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like numerals throughout the drawings.

DETAILED DESCRIPTION OF THE INVENTION

Figure 1:
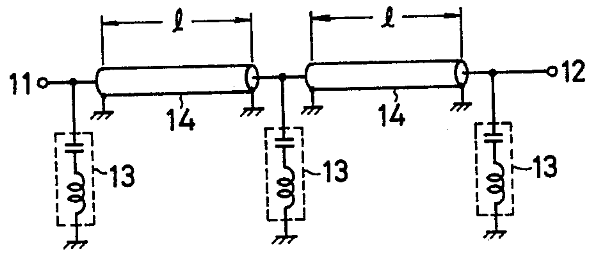
FIG. 1 PRIOR ART
FIG. 1 is a circuit diagram of a conventional band-stop filter.

Prior to describing the preferred embodiments of the present invention, the above-mentioned conventional band-stop filters will be described for a better understanding of the present invention. FIG. 1 shows a conventional multi-stage band-stop filter which is typically used in the VHF-UHF bands. The illustrated example is of a type having three stages, namely the band-stop filter has three series resonance circuits 13. Each of the resonance circuits 13 comprises a series circuit of an inductor and a capacitor. The reference numerals 11 and 12 respectively indicate input and output terminals of the band-stop filter. Two transmission lines 14 are provided so that each transmission line 14 is connected between two series resonance circuits 13. Each resonance circuit 13 is of distributed constant type, and has a high value of unloaded Q. Each of the transmission lines 14 may comprise a coaxial cable when the center frequency is lower than 1000 MHz. The length of each transmission line 14 is usually selected to a value corresponding to a quarter wavelength of the center frequency, and under such condition, the attenuation characteristic curve is substantially symmetrical with respect to the center frequency (see curve "a" in FIG. 3).

Figure 3:
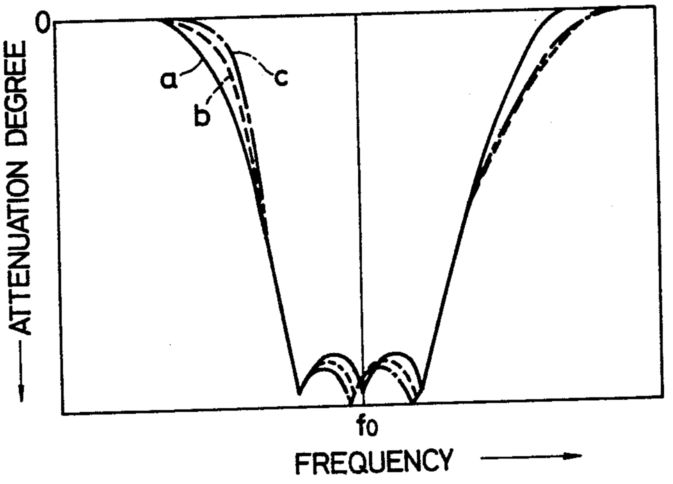
FIG. 3 is a graph showing attenuation characteristics of conventional three-stage band-stop filters and the first embodiment of FIG. 2.

Although symmetry is satisfactorily obtained by the above-described conventional band-stop filter, the sharpness in attenuation characteristic curve is sometimes inadequate. In order to improve the sharpness, the inventors of the present invention proposed an arrangement in which the length of each transmission line 14 is made shorter than the quarter wavelength by 5 to 20 percent, prior to the present invention. The attenuation characteristic curve obtained by such a band-stop filter having shorter transmission lines is nonsymmetrical with respect to the center frequency. The curve "b" of FIG. 3 shows an attenuation characteristic of a band-stop filter having transmission lines whose length has been made shorter than the quarter wavelength by approximately 20 percent. It will be understood from the curve "b" that the attenuation characteristic thereof is sharper than the curve "a" in a frequency range below the center frequency fo, while symmetry is lost. Instead of making the transmission line shorter than the quarter wavelength, the length may be lengthened from the quarter wavelength by 5 to 20 percent. In this case, the attenuation characteristic can be sharpened in a frequency range above the center frequency.

From the above it will be understood that the sharpness of attenuation characteristic of a band-stop filter can be improved to an extent by either decreasing or increasing the length of each transmission line between series resonance circuits. However, the above-described known technique has a limit, and therefore, it has been desired to develop a band-stop filter having a further sharp attenuation characteristic which is needed in some cases.

Figure 2:
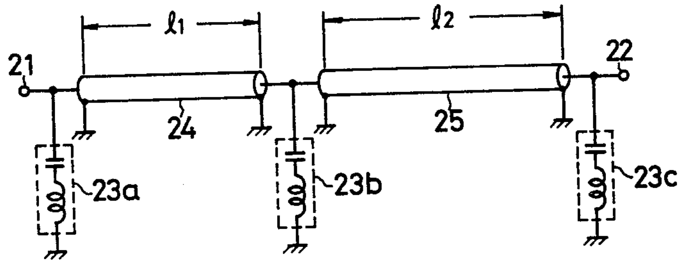
FIG. 2 is a schematic circuit diagram of a first embodiment of the band-stop filter according to the present invention.

Reference is now made to FIG. 2 which shows a schematic circuit diagram of a first embodiment of the band-stop filter according to the present invention. The band-stop filter comprises a plurality of series resonance circuits. In the illustrated embodiment, three resonance circuits *23a*, *23b* and *23c* each having an inductor and a capacitor are shown. The first to third resonance circuits *23a* to *23c* are identical. The reference numerals 21 and 22 respectively indicate input and output terminals of the band-stop filter, and the first resonance circuit *23a* is connected between the input terminal 21 and ground, while the third resonance circuit *23c* is connected between the output terminal 22 and ground. A first transmission line 24 is connected between the first and second series resonance circuits *23a* and *23b*, while a second transmission line 25 is connected between the second and third series resonance circuits *23b* and *23c*. Each of the transmission lines 24 and 25 may comprise a coaxial cable when the center frequency is lower than 1000 MHz. On the other hand, when the center frequency is higher than 1000 MHz, striplines may be used as the transmission lines 24 and 25. The above-described structure is substantially the same as that of the conventional band-stop filter of FIG. 1. The first embodiment of FIG. 2 differs from the conventional one in that the length of the first transmission line 24 interposed between the first and second resonance circuits *23a* and *23b* is made shorter than the quarter wavelength by more than 20 but less than 50 percent. The second transmission line 25 may have a length corresponding to the quarter wavelength. However, the length of the second transmission line 25 may be shortened from the quarter wavelength by 5 to 20 percent to further improve the sharpness.

The first embodiment band-stop filter having transmission lines 24 whose lengths are respectively shorter than the quarter wavelength as mentioned in the above, provides an attenuation characteristic as shown qualitatively by the curve "c" of FIG. 3. Namely, the attenuation characteristic below the center frequency $f_o$ has been further sharpended compared to the curves "a" and "b" obtained in the conventional or known arrangements.

In the first embodiment of FIG. 2, if the length of the first transmission line 24 is reduced by more than 50 percent, the insertion loss at the pass band increases so that the band-stop filter is not practical. For this reason, the length of the first transmission line 24 connected to the input terminal 24 should be set to a value which is between 50 and 80 percent of the quarter wavelength.

In the first embodiment of FIG. 2, although it has been described that the first transmission line length l1 is made shorter than the quarter wavelength so that the attenuation characteristic becomes sharp in a frequency range below the center frequency $f_o$, the length of the same may be made longer than the quarter wavelength to obtain sharp attenuation characteristic in a frequency range above the center frequency. Namely, when it is intended to provide a band-stop filter having a sharp attenuation characteristic in a frequency range above the center frequency $f_o$, the length of the first transmission line 24 should be made longer than the quarter wavelength. In this case, the length l2 of the second transmission line 25 is preferably made longer than the quarter wavelength by 5 to 20 percent so that further sharpness will be achieved.

A second embodiment of the band-stop filter according to the present invention will be described with reference to FIG. 4. The second embodiment is of a four-stage type, and will be described by taking an example in which the sharpness of the attenuation characteristic in a frequency range below the center frequency $f_o$ is improved.

Figure 4:
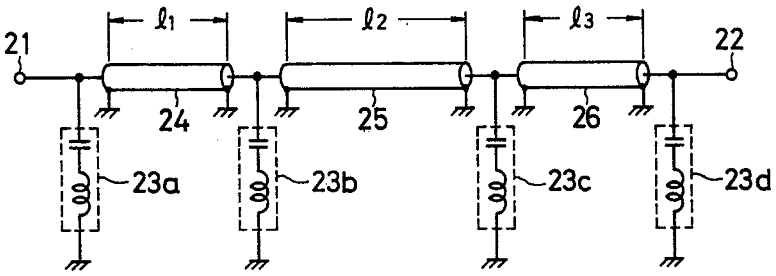
FIG. 4 is a schematic circuit diagram of a second embodiment of the band-stop filter according to the present invention.

As illustrated in FIG. 4, the second embodiment band-stop filter comprises four series resonance circuits *23a*, *23b*, *23c* and *23d*, and three transmission lines 24, 25 and 26. Namely, the second embodiment differs from the above-described first embodiment of FIG. 2 in that the numbers of the resonance circuits and transmission lines are both increased by one. In the arrangement of FIG. 4, the first and third transmission lines 24 and 26, which are respectively connected to the input and output terminals 21 and 22, are made shorter than the quarter wavelength by more than 20 but less than 50 percent. The length of the second transmission line 25 may be equal to the quarter wavelength as described in connection with the first embodiment. However, in order to better the sharpness of the attenuation characteristic, the length l2 of the second transmission line 25 is made shorter than the quarter wavelength by 20 percent.

In detail, assuming that the center frequency $f_o$ in the stop band is 450 MHz, and the stop band width is 5 MHz so as to provide a pass band ranging from 438.5 MHz to 443.5 MHz having a center frequency of 441 MHz, the quarter wavelength is approximately 167 mm. Under these conditions, when a coaxial cable having a wavelength reducing factor of approximately 70 percent is used as the first transmission line 24, the actual length of the coaxial cable corresponding to the quarter wavelength equals approximately 117 mm. Accordingly, the actual length of each of the first and third transmission lines 24 and 26 is 60 mm so that their electrical lengths equal a length which is 51 percent of the quarter wavelength. The length of the second transmission line 25 is set to 93 mm so that its electrical length is shorter than the quarter wavelength by 20 percent.

Figure 5:
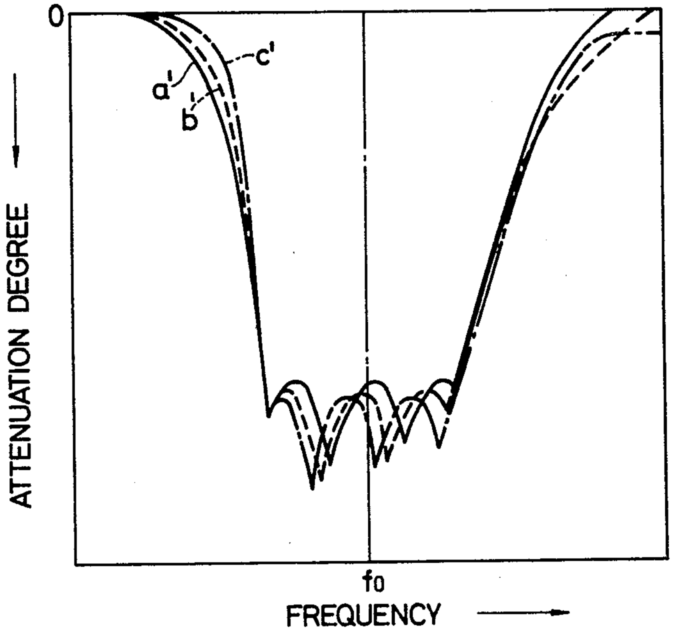
FIG. 5 is a graph showing attenuation characteristics of conventional four-stage band-stop filters and the second embodiment of FIG. 4.

A curve "c′" in FIG. 5 shows the attenuation characteristic of the second embodiment band-stop filter in which the lengths of the first to third transmission lines 24 to 26 are respectively set as mentioned in the above. In FIG. 5, a curve "a′" shows an attenuation characteristic of a conventional four-stage band stop filter corresponding to the case that l1 to l3 of the first to third transmission lines of FIG. 4 are set to the quarter wavelength, while another curve "b′" shows an attenuation characteristic of another conventional four-stage band stop filter corresponding to the case that l1 to l3 of FIG. 4 are set to a value which is shorter than the quarter wavelength by 20 percent.

Comparing the value of the insertion loss at the upper limit of the pass band, i.e. 443.5 MHz, obtained by the second embodiment of FIG. 4 with the above-mentioned two conventional examples, it will be understood that the attenuation characteristic shown by the curve "c'" is improved by 27.4 percent from the first conventional characteristic "a'" and by 16.5 percent from the second conventional characteristic "b'" because the attenuation degree in the second embodiment is 1.06 dB, while the attenuation degrees in the conventional examples "a'" and "b'" are respectively 1.46 dB and 1.27 dB. From the above result of experiments, it will be understood that the sharp attenuation characteristic curve according to the present invention satisfactorily rejects an unwanted frequency signal and satisfactorily passes a wanted frequency signal even if these unwanted and wanted frequency signals have small frequency difference therebetween.

In the above, although it has been described that the attenuation characteristic was sharpened in a frequency range below the center frequency of the stop band, the attenuation characteristic in a frequency range above the center frequency $f_o$ may be sharpened by increasing the length of at least the first and third transmission lines 24 and 26 beyond the quarter wavelength by more than 20 but less than 50 percent.

Figure 6:
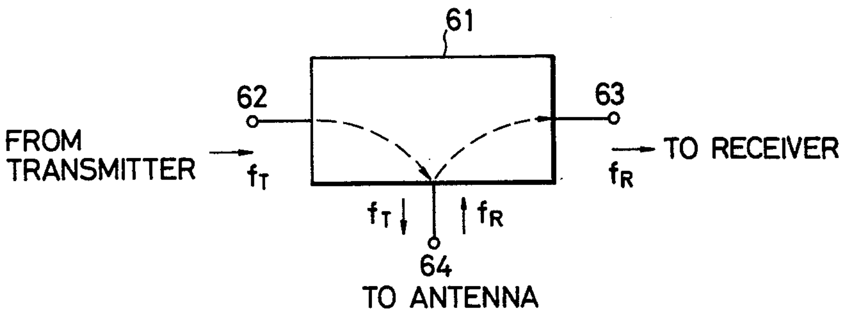
FIG. 6 is an explanatory diagram for the description of the operation of a common-antenna coupler which is used for a transceiver.

Now an example of an application of the present invention will be described. FIG. 6 is a schematic functional view of a common-antenna coupler which may be used for a transceiver used in a mobil radio communication system or the like. The reference numeral 61 generally designates the common-antenna coupler for duplex operation; 62, an input terminal to be connected to a transmitter output terminal; 63 an output terminal to be connected to a receiver input; and 64, an antenna terminal to be connected to an antenna. This common-antenna coupler 61 is used for a transceiver of the type capable of transmitting and receiving radio waves simultaneously. Therefore, it is necessary that an input receiving frequency $f_R$ from the antenna is fed to the output terminal 63 without being sent to the input terminal 62, and also an output transmitting frequency $f_T$ from the input terminal 62 is fed to the antenna terminal 64 without being sent to the output terminal 63.

Figure 7:
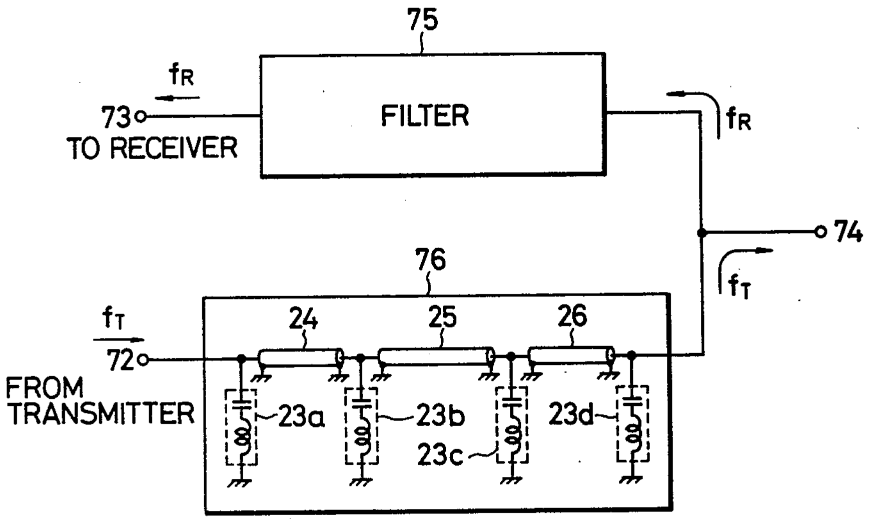
FIG. 7 is a circuit diagram of a common-antenna coupler having the band-stop filter according to the present invention.

FIG. 7 illustrates a schematic circuit diagram of a common-antenna coupler for duplex operation actualized by employing the band-stop filter according to the present invention so that the above-mentioned required function is ensured. The common-antenna coupler of FIG. 7 comprises two filters 75 and 76; one for an unshown receiver connected to a terminal 73, and the other for an unshown transmitter connected to a terminal 72. Another terminal 74 is to be connected to an antenna. While the filter 75 connected between the antenna and the receiver is a conventional band-pass or band-stop filter, the other filter 76 connected between the transmitter and the antenna corresponds to the second embodiment of FIG. 4. The common-antenna coupler may be used in a band of several hundred MHz, where the difference between the transmitting and receiving frequencies is 10 MHz or so, and the signal band width is 5 MHz. Since the second embodiment band-stop filter has a sharp attenuation characteristic in a frequency range below the center frequency fo, the common-antenna coupler of FIG. 7 is suitable for a case that the transmitting frequency $f_T$ is lower than the receiving frequency $f_R$. Namely, the center frequency of the stop band of the band-stop filter is set to the receiving frequency $f_R$ so that the receiving frequency $f_R$ signal is prevented from being transmitted to the transmitter. In the common-antenna coupler of FIG. 7, a band-stop filter according to the present invention may also be used as the filter 75 connected to the receiver.

From the foregoing description, it will be understood that the present invention provides a sharp attenuation characteristic, which is required in various cases, without employing a complex structure, while the band-stop filter according to the present invention can be manufactured at a low cost because the number of elements is relatively small. Moreover, the band-stop filter according to the present invention is small in size and light in weight, and thus it can be fitted in a limited space of various devices. Since the sharpness of attenuation characteristic can be varied and set to a desired value merely by making the length of the transmission line or lines shorter or longer than the quarter wavelength of the center frequency, the band-stop filter according to the present invention may be practically used.

The above-described embodiments are just examples of the present invention, and therefore, it will be apparent for those skilled in the art that many modifications and variations may be made without departing from the spirit of the present invention.

What is claimed is:

1. A band-stop filter for VHF-UHF band, comprising:

(a) at least three series resonance circuits, one of said series resonance circuits being connected between an input terminal and ground, and another one of said series resonance circuits being connected between an output terminal and ground; and (b) a plurality of transmission lines each connected between said series resonance circuits, said transmission lines having different electrical lengths from each other, one of said transmission lines having an electrical length which is shorter or longer than the quarter wavelength of the center frequency of the stop band of said band-stop filter by more than 20 but less than 50 percent, while at least one of remaining transmission line or lines having electrical length which is equal to said quarter wavelength or shorter or longer than said quarter wavelength by less than 20 percent.

2. A band-stop filter as claimed in claim 1, wherein said one of said transmission lines is connected to said input terminals and wherein at least one of the remaining transmission lines has an electrical length which differs from the quarter wavelength of the center frequency of the stop band of said band-stop filter by 5 to 20 percent.

3. A band-stop filter as claimed in claim 1, wherein the number of said transmission lines is two.

4. A band-stop filter as claimed in claim 1, wherein said one of said transmission lines is connected to said output terminal and has an electrical length which is shorter or longer than the quarter wavelength of the center frequency of the stop band of said band-stop filter by more than 20 but less than 50 percent.

5. A band-stop filter as claimed in claim 4, wherein said at least one of said remaining transmission lines is neither connected to said input terminal nor to said output terminal, and has an electrical length which is shorter or longer than the quarter wavelength of the center frequency of the stop band of said band-stop filter by 5 to 20 percent.

6. A band-stop filter as claimed in claim 4 or 5, wherein the number of said transmission lines is three.

7. A band-stop filter as claimed in claim 1, wherein each of said transmission line comprises a coaxial cable.

* * * * *